(12) United States Patent
Luecke et al.

(10) Patent No.: US 7,545,220 B2
(45) Date of Patent: Jun. 9, 2009

(54) METHOD FOR SHAPING SIGNAL PULSES

(75) Inventors: Svenn Luecke, Unterschleissheim (DE);
Andreas Salomon, Unterschleissheim (DE); Gebhard Hoffmann, Munich (DE); Markus Wedemeyer, Oberschleissheim (DE)

(73) Assignee: EADS Deutschland GmbH, Ottoburnn (DE)

( * ) Notice: Subject to any disclaimer, the term of this patent is extended or adjusted under 35 U.S.C. 154(b) by 0 days.

(21) Appl. No.: 11/168,345

(22) Filed: Jun. 29, 2005

(65) Prior Publication Data

US 2006/0001466 A1    Jan. 5, 2006

(30) Foreign Application Priority Data

Jun. 30, 2004    (DE) ................. 10 2004 031 603

(51) Int. Cl.
*H03F 3/19*    (2006.01)
*H03G 3/30*    (2006.01)

(52) U.S. Cl. .................. 330/310; 330/285; 330/51

(58) Field of Classification Search ......... 327/560–563; 330/133, 279, 254, 285, 156, 310, 51
See application file for complete search history.

(56) References Cited

U.S. PATENT DOCUMENTS

| | | | | |
|---|---|---|---|---|
| 4,322,689 A | * | 3/1982 | Schucht | 330/285 |
| 4,554,511 A | * | 11/1985 | Braun | 330/9 |
| 4,910,478 A | * | 3/1990 | Koyama | 330/278 |
| 5,216,384 A | * | 6/1993 | Vanhecke | 330/279 |
| 5,357,206 A | * | 10/1994 | Ash | 330/51 |
| 6,049,252 A | * | 4/2000 | Iwata | 330/254 |
| 6,380,804 B1 | * | 4/2002 | Ross | 330/51 |
| 6,603,359 B2 | * | 8/2003 | Fujiwara et al. | 330/310 |
| 6,771,128 B1 | * | 8/2004 | Yamashita et al. | 330/285 |

FOREIGN PATENT DOCUMENTS

| | | |
|---|---|---|
| DE | 29 04 011 | 8/1980 |
| EP | 0 380 361 A2 | 8/1990 |
| JP | 57-076932 A | 5/1982 |
| JP | 60-127806 A | 7/1985 |
| JP | 02-146822 A | 6/1990 |
| JP | 02-166908 | 6/1990 |
| JP | 02-268008 A | 11/1990 |

OTHER PUBLICATIONS

Tietze, U.; Schenk, Ch.: Halbleiter-Schaltungstechnik, 11. Aufl., Berlin [u.a.]: Springer, 1999, S. 595-598, ISBN 3-540-64192-0.

* cited by examiner

*Primary Examiner*—Dinh T. Le
(74) *Attorney, Agent, or Firm*—Crowell & Moring LLP

(57) ABSTRACT

The invention relates to a method and apparatus for shaping an input signal $S_{on}$ which is input to a multi-stage amplifier arrangement, to provide a definable output signal contour $S_{off}$. Individual amplifier stages are controlled by a control signal generated by a pulsed current source of a definable pulse length T. According to the invention, successive amplifier stages are each controlled (switched on) after a definable delay time $\Delta t_{on\ 1}$, $\Delta t_{on\ 2}$ following the preceding stage. Each amplifier stage has an assigned pulsed current source for generating the control signals of definable pulse length T. One such pulse generator respectively is assigned to each current source.

4 Claims, 2 Drawing Sheets

METHOD FOR SHAPING SIGNAL PULSES

This application claims the priority of German patent document No, 10 2004 031 603.1, filed Jun. 30, 2004, the disclosure of which is expressly incorporated by reference herein.

BACKGROUND OF THE INVENTION

The invention relates to a method of forming a signal entered into a multistage amplifier, into a desired pulse contour or spectrum.

German Patent Document DE 29 04 011 C3 discloses a high-frequency amplifier which includes series-connected power transistor amplifier stages 22, 23, 24 constructed in a common base circuit, as illustrated in FIG. 1. High-frequency pulses $S_{on}$ entered through an input adaptation network are amplified on the emitter side and are output on the collector side via an output adaptation network $S_{off}$, with the pulses having a defined envelope form. A constant current source 25, 26, 27 controlled by a pulse generator 10 is connected to each amplifier stage 22, 23, 24, and impresses a current corresponding to the course of the pulse onto the collector-emitter path of the respective power transistor 22, 23, 24 for the duration of each pulse 29 emitted by the pulse generator 10.

This circuit has the disadvantage, however, that interactions between the individual stages may occur during the simultaneous switching-on or switching-off of the amplifier stages, because each power transistor exhibits a different transient response. Such interactions may lead to undesirable spectral fractions.

SUMMARY OF THE INVENTION

One object of the present invention is to provide a method of shaping signal pulses which avoids the creation of non-linear distortions during switching operations of power amplifiers.

Another object of the invention is the providing of a circuit for shaping signals using the method according to the invention.

These and other objects and advantages are achieved by the method according to the invention, in which each of the individual amplifier stages is controlled by a control signal (pulse) of a definable pulse duration, and, each successive amplifier stage is controlled (switched on) with a definable delay time $\Delta t_{on\,1}$, $\Delta t_{on\,2}$ relative to the preceding stage. During the control pulse (and thus, when a control signal is applied to the amplifier stage), the amplifier stage is switched on and amplifies the input signal. By staggering operation of the amplifier stages with respect to the time, the effect of non-linear distortions is avoided during the switching operations of the power amplifiers, because first each amplifier stage can carry out transient successive oscillations before the following stage is activated. Interference in the region of the output signal spectrum close to the carrier can therefore be minimized. A correspondingly time-coordinated switching-on and switching-off of the cascaded amplifier stages improves the signal spectrum in the region close to the carrier.

In the circuit according to the invention, one pulse generator is assigned to each respective current source, and generates the control signal to the amplifier stage assigned to the current source. As a result, it is ensured that the individual amplifier stages are supplied with a control signal independently of one another.

By means of the method and apparatus according to the invention, a transmission spectrum can be generated which has a high spectral purity in the region close to the carrier.

In an advantageous embodiment of the method according to the invention, the individual amplifier stages are controlled in a time sequence of a rising amplifier output power. This means that amplifier stages with a high amplifier output power are switched on (controlled) after amplifier stages with a low amplifier output power, in time sequence. This time delay in the controlling of successive amplifier stages is also called a starting delay.

Advantageously, the amplifier output power of the individual amplifier stages is inversely proportional to the pulse duration of the respective control signal of the amplifier stage. Therefore, amplifier stages with a low amplifier output power are controlled (and therefore switched on) longer than those amplifier stages which have a higher amplifier output power.

In an advantageous embodiment of the invention, the amplifier stages are switched off in the reversed sequence of their switching-on after a definable delay time, which is also referred to as a stopping delay. Expediently, the amplifier stages can also be switched off simultaneously.

Other objects, advantages and novel features of the present invention will become apparent from the following detailed description of the invention when considered in conjunction with the accompanying drawings.

DETAILED DESCRIPTION OF THE DRAWINGS

Figure 1:
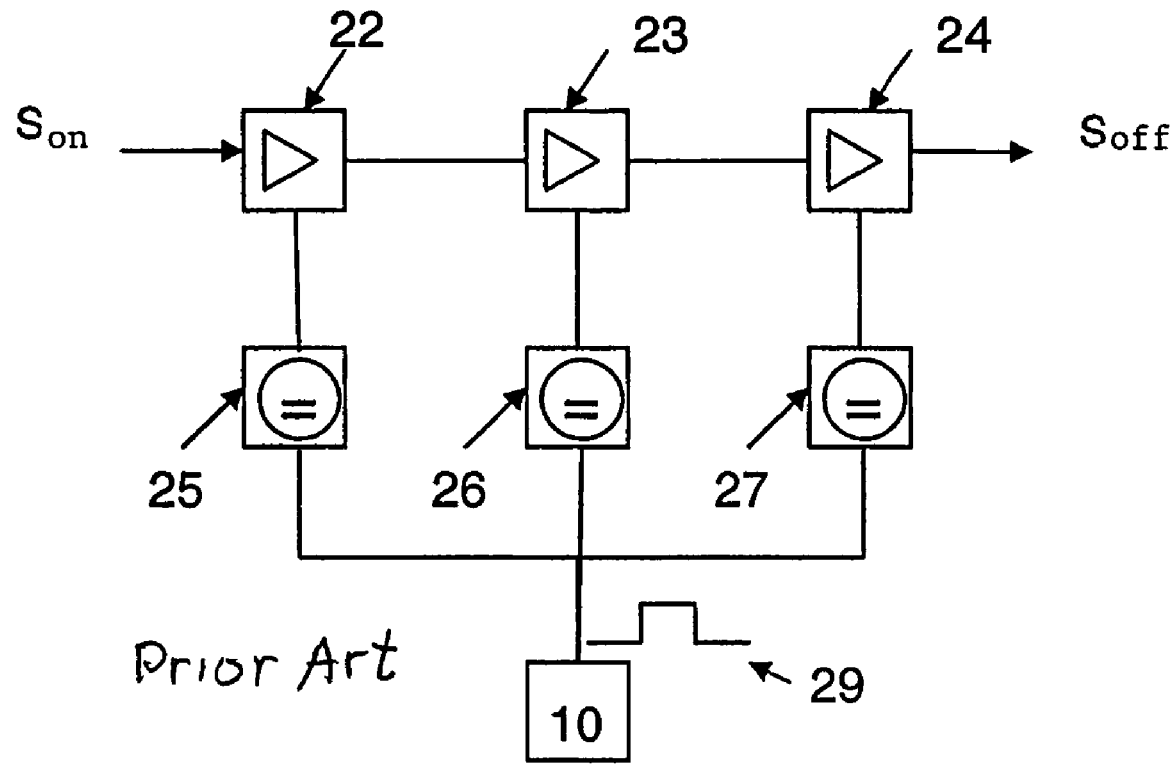
FIG. 1 shows the circuit construction of a multi-stage amplifier arrangement according to the state of the art.
Figure 2:
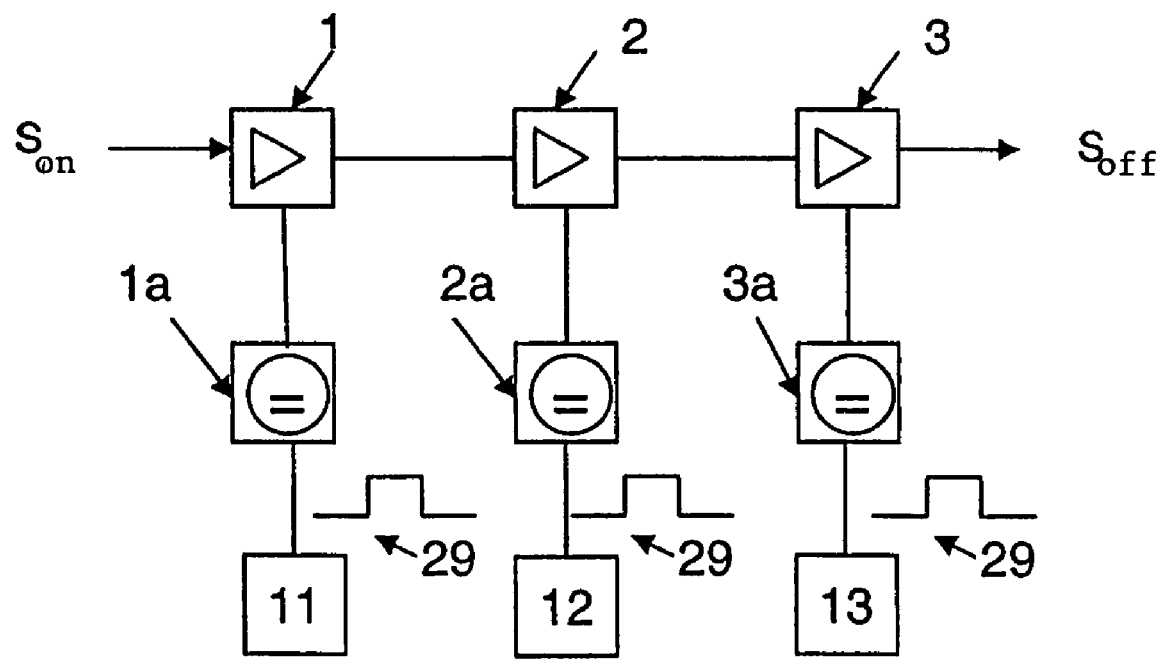
FIG. 2 shows the circuit construction of a three-stage amplifier arrangement according to the invention.

FIG. 2 is a schematic diagram of a three-stage amplifier arrangement according to the invention. The individual amplifier stages 1, 2, 3 are connected in series, and are wired in the sequence of increasing amplifier output power. Thus, in the present embodiment, the amplifier stage 1 has the lowest amplifier output power, while the amplifier stage 3 has the highest.

The individual amplifier stages 1, 2, 3 typically comprise bipolar transistors (not shown). Each amplifier stage is connected with a pulsed current source 1a, 2a, 3a that is connected with the emitter of the respective bipolar transistor.

In addition, each current source 1a, 2a, 3a is connected with a pulse generator 11, 12, 13 respectively, ensuring that control of the individual amplifier stages 1, 2, 3 takes place in a mutually independent manner. A separate current source 1a, 2a, 3a is assigned to each amplifier stage 1, 2, 3, and in turn a separate pulse generator 11, 12, 13 is assigned to each current source 1a, 2a, 3a. As noted, this ensures mutually independent control of the individual amplifier stages 1, 2, 3.

A preamplifier stage can also be arranged in the circuit, upstream of the three amplifier stages 1,2,3, so that an input signal $S_{on}$ can be fed to the preamplifier stage.

Figure 3:
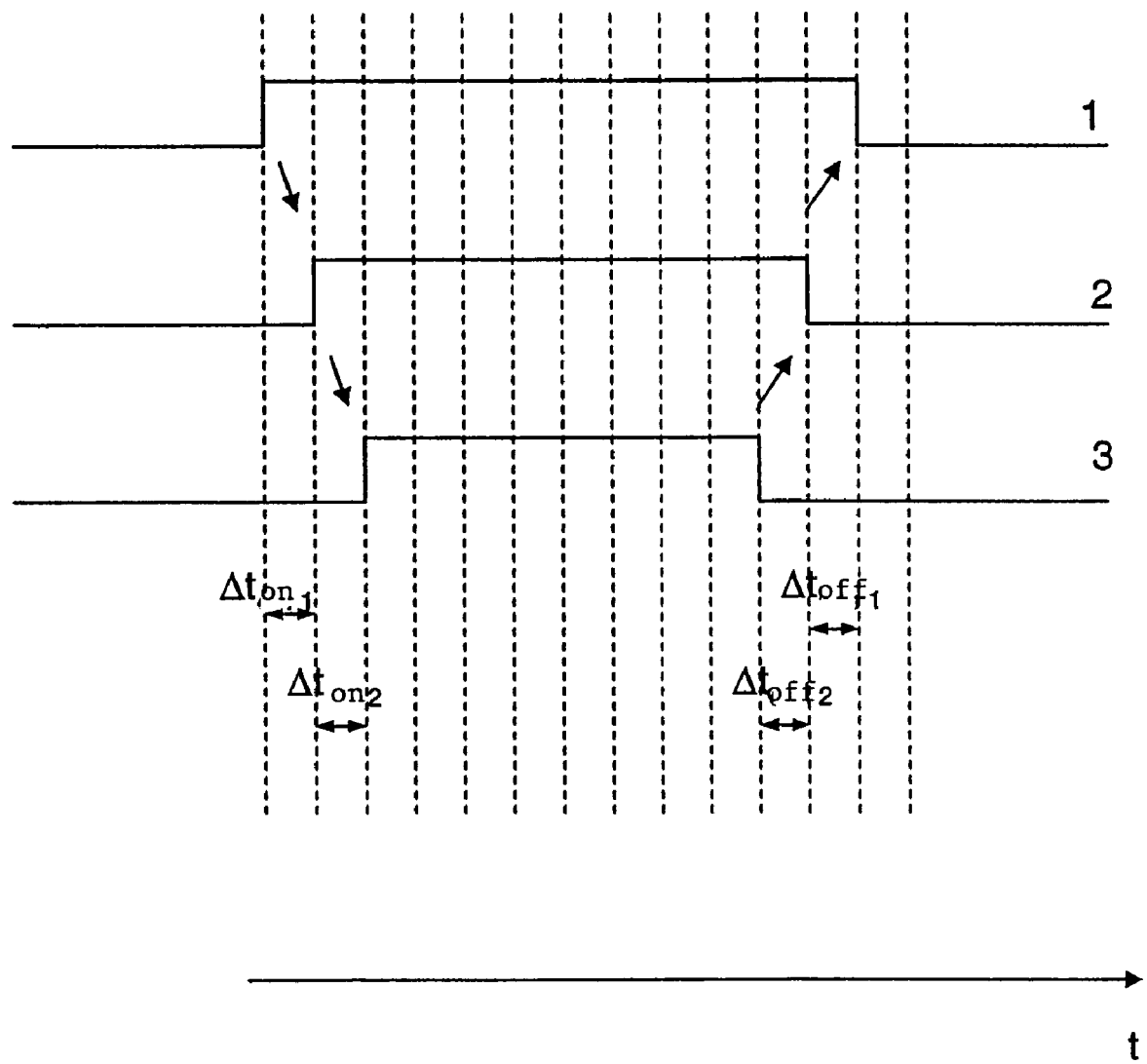
FIG. 3 is a graphic depiction of the time sequence of the control signals of a three-stage amplifier arrangement according to the invention.

FIG. 3 shows an example of the time sequence of the respective control signals for the individual amplifier stages. As can be seen, relative to time, amplifier stage 1 is controlled (turned on) before amplifier stage 2 which, in turn, is controlled before amplifier stage 3. The respective time segments $\Delta t_{on\,1}$, $\Delta t_{on\,2}$ of the starting delay are individually adjustable.

As the illustration also shows, the individual amplifier stages 1, 2, 3 are switched off again in the reverse sequence of their switching-on, with the illustrated stopping delays $\Delta t_{off\,1}$, $\Delta t_{\textit{off} 2}$ also being individually adjustable, in the same manner. Naturally, the stopping delays can also be reduced to 0 seconds, which indicates a simultaneously switching-off of all amplifier stages 1, 2, 3.

The time segments $\Delta t_{on\,1}$, $\Delta t_{on\,2}$, $\Delta t_{\textit{off} 1}$, $\Delta t_{\textit{off} 2}$ need not be identical, but are freely selectable. In this case, the different starting and stopping delays are selected such that a spectral optimum is obtained.

The illustration clearly shows that the individual amplifier stages 1, 2, 3 are switched on in the sequence of a rising amplifier output power and are switched off in the reversed sequence.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A circuit for shaping an input signal which is input to a multi-stage amplifier arrangement, to provide a definable output signal spectrum, comprising:

a plurality of individual amplifier stages coupled in series, each having an associated pulsed current source that impresses a current corresponding to a definable pulse length upon a respective one of the amplifier stages for sequentially switching on all of the individual amplifier stages; and a plurality of independent pulse generators, each of which is operatively connected to a respective one of said pulsed current sources to generate control signals that independently control the associated individual amplifier stages to avoid creation of non-linear distortion during switching operations of the plurality of individual amplifier stages.

2. The circuit according to claim 1, wherein the individual amplifier stages are configured with a starting delay so as to be switched on sequentially in an order of rising amplifies power output.

3. The circuit according to claim 1, wherein each of the individual amplifies stages is configured to have an output power that is inversely proportional to the associated definable pulse length.

4. The circuit according to claim 2, wherein the individual amplifier stages are operable to provide a stopping delay so as to switch off the individual amplifier stages in a reverse sequence of their switching on.

* * * * *